US007466005B2

United States Patent
Chiola

(10) Patent No.: US 7,466,005 B2
(45) Date of Patent: Dec. 16, 2008

(54) RECESSED TERMINATION FOR TRENCH SCHOTTKY DEVICE WITHOUT JUNCTION CURVATURE

(75) Inventor: Davide Chiola, Marina del Rey, CA (US)

(73) Assignee: International Rectifier Corporation, El Segundo, CA (US)

( * ) Notice: Subject to any disclaimer, the term of this patent is extended or adjusted under 35 U.S.C. 154(b) by 104 days.

(21) Appl. No.: 11/077,929

(22) Filed: Mar. 11, 2005

(65) Prior Publication Data

US 2005/0202637 A1  Sep. 15, 2005

Related U.S. Application Data

(60) Provisional application No. 60/552,140, filed on Mar. 11, 2004.

(51) Int. Cl.
*H01L 27/095* (2006.01)

(52) U.S. Cl. .......... 257/484; 257/509; 257/510
(58) Field of Classification Search .......... 257/484, 257/509, 510
See application file for complete search history.

(56) References Cited

U.S. PATENT DOCUMENTS 6,825,105 B2 * 11/2004 Grover et al. .......... 438/570
2005/0062124 A1 * 3/2005 Chiola .......... 257/476

* cited by examiner

*Primary Examiner*—Long Pham
(74) *Attorney, Agent, or Firm*—Ostrolenk, Faber, Gerb & Soffen, LLP

(57) ABSTRACT

A trench type Schottky device has a guard ring diffusion of constant depth between the outermost of an active trench and an outer surrounding termination trench. The junction curvature of the guard ring diffusion is suppressed or cut out by the trenches.

3 Claims, 2 Drawing Sheets

RECESSED TERMINATION FOR TRENCH SCHOTTKY DEVICE WITHOUT JUNCTION CURVATURE

RELATED APPLICATIONS

This application claims the benefit of U.S. Provisional Application No. 60/552,140, filed Mar. 11, 2004.

FIELD OF THE INVENTION

This invention relates to semiconductor devices, and more specifically relates to a novel structure and process for the manufacture of trench Schottky devices.

BACKGROUND OF THE INVENTION

Trench Schottky devices are well known. The termination structure of such devices have had regions of juncture curvature of the standard guard ring which limited device breakdown voltage and caused "walk-out" of the breakdown voltage. Further, the provision of the P+ guard ring in the trench Schottky has required an added diffusion process thus increasing the thermal budget, leading to substrate out-diffusion.

BRIEF SUMMARY OF THE INVENTION

In accordance with the present invention, a novel trench termination is employed in a process which incorporates a P+ guard ring. Thus, the trench termination removes the external curvature of the P+ guard ring. Further, the P+ guard ring is formed without introducing an additional diffusion and maintaining the same thermal budget as a standard process flow. This eliminates the effect of substrate out diffusion (which corresponds to epi thinning) on the guard ring boron drive-in. In particular, boron drive in takes place during a high temperature thermal gate oxidation process.

Thus, in the final device, the breakdown voltage (BV) is improved by elimination of the guard ring junction curvature. Further, a dry oxidation step (850° C.) seals the trench sidewall to avoid boron out-diffusion, before ramping up to about 1175° C. fro the full diffusion step. The termination oxide thickness is increased by a TEOS layer which is patterned before metal deposition. This thick oxide reduces the E field at the tip of the field plate. BV walk-out has thus been reduced or eliminated.

BRIEF DESCRIPTION OF THE DRAWINGS

Figure 1:
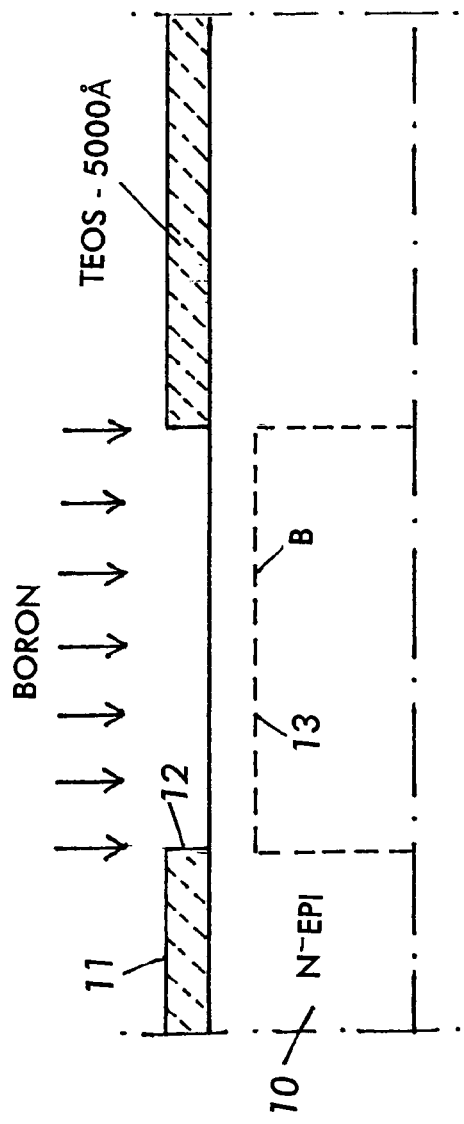
FIG. 1 is a cross-section of a small part of the area of a Schottky device after the growth of a TEOS layer and the opening of a window for a P+ guard ring.

Referring first to FIG. 1, a silicon substrate is provided having an epitaxial layer 10 (silicon) thereon. A TEOS insulation layer (typically 5000 Å thick) or another insulation layer is formed on the silicon surface and a mask operation is carried out, forming a ring-shaped diffusion window 12. Window 11 may have other topologies such as a stripe or the like. A boron implant is then carried out to implant boron atoms 13 of any suitable dose and energy through the silicon surface exposed by window 12. Species other than boron can of course be used.

Figure 2:
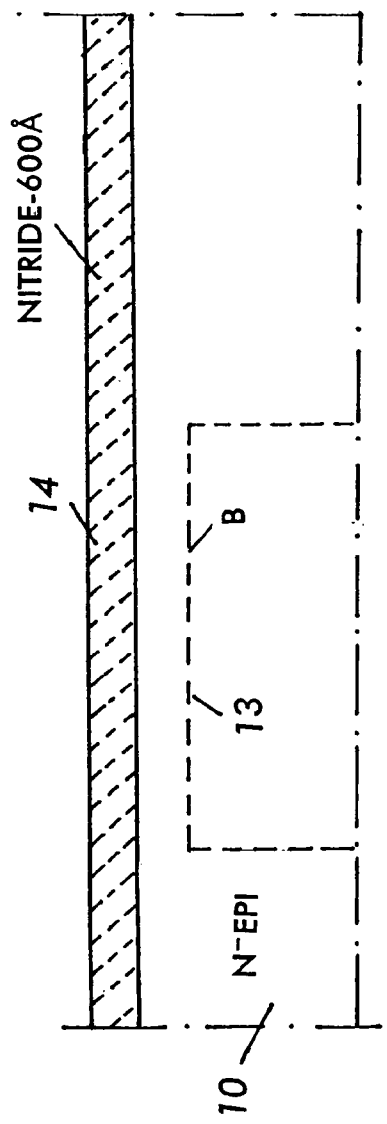
FIG. 2 is a cross-section of the device of FIG. 2 after a boron implant and the formation of nitride layer.

The TEOS layer 11 is then stripped and a nitride layer 14 is deposited on the top surface of silicon 10, as shown in FIG. 2. Nitride layer 14 may have a non-critical thickness of about 600 Å.

Figure 3:
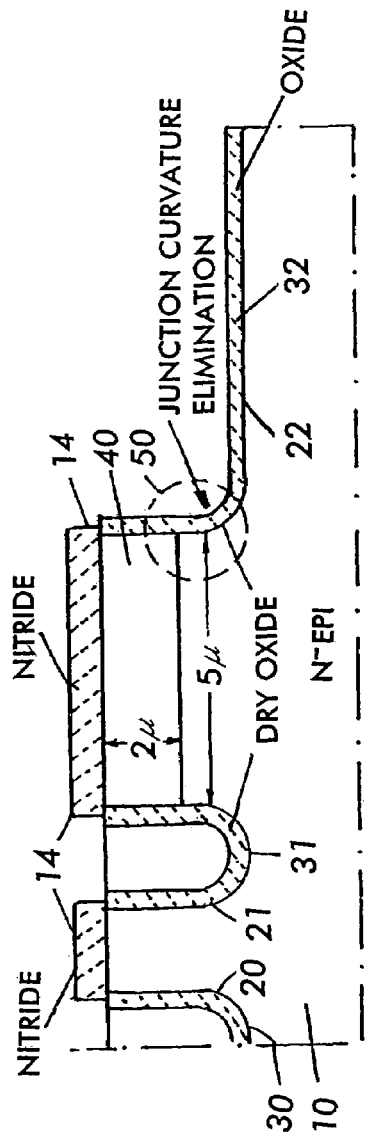
FIG. 3 shows the cross-section of FIG. 2 after the formation of active area trenches and a termination trench.
Figure 4:
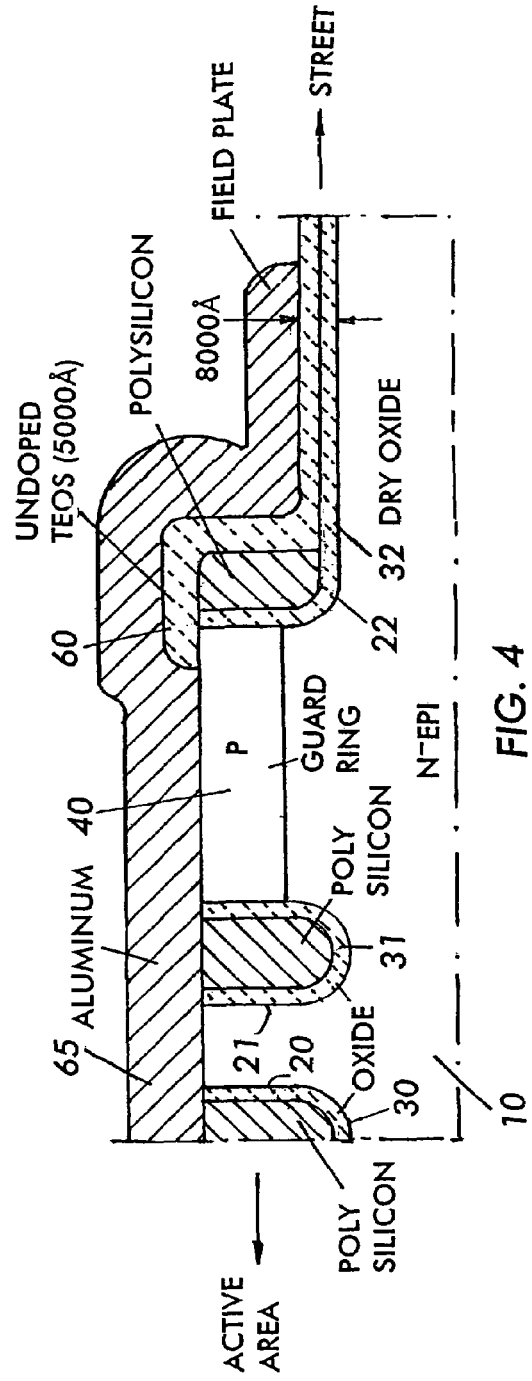
FIG. 4 shows the cross-section of FIG. 3 after the completion of the device.

Thereafter, and as shown in FIG. 3, a trench mask step is carried out, and active trenches such as trenches 20, 21 are formed, and a termination etch 22 is also carried out. The termination trench etch and the active etch 21 cut through respective side edges of the boron implant 13 (of FIG. 2). For example, the boron implant (and window 12) may have a width of about 7µ and the opposite surfaces of etches 21 and 22 may be about 5µ apart, symmetrically centered about the 7µ window 12. These exact dimensions are not critical and it is only necessary that the trenches cut through the implant 13 edges.

A gate oxidation is next carried out in FIG. 3. This process step comprises a first 850° C. dry oxide step to seal the trench side walls and avoid later boron out-diffusion. The oxide step temperature is then ramped up to about 1175° C. to complete the formation of oxide liners 30, 31 and 32 in trenches 21, 22 and 23 respectively. During this process, the boron implant 13 of FIG. 2 is driven to form the P+ guard ring diffusion 40 in FIG. 3.

Thus, the P+ guard ring 40 is formed without a separate diffusion step, and eliminates the effect of out-diffusion during the guard ring boron drive which could otherwise result from the high temperature gate oxidation process.

Significantly, the region of junction curvature which would have been formed in region 50 (FIG. 3) is eliminated by trench 22 (and by trench 31).

An undoped TEOS layer is then deposited, masked and etched to form the final TEOS layer 60 over the trench termination, bringing the total field oxide thickness to about 8000 Å (non-critical).

A conventional aluminum metal 65 is then deposited atop the device, and a bottom contact, not shown is also formed.

The device shown and the process described are used to form a 100 volt Schottky. The process parameters can be changed as will be well known to form other voltage rating devices.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A trench type semiconductor device comprising an active area consisting of a plurality of spaced active trenches filled with conductive polysilicon and surrounded by a termination trench which is laterally spaced from an adjacent one of said active trenches; said trenches being formed in a wafer of silicon of one of the conductivity types; and a guard ring diffusion of the other of the conductivity types diffused into the area between said adjacent one of said active trenches and said termination trench and having a constant depth which is less than the depth of said one of said active trenches and the depth of said termination trench; an electrode connected to said conductive polysilicon in said active trenches, and to the surface of said guard ring diffusion and to tops of mesas between said spaced active trenches, thereby to form a schottky device, wherein said guard ring diffusion extends from said adjacent one of said active trenches to said termination trench.

2. The trench type semiconductor device of claim 1, wherein said guard ring has a depth of about 2µ and a width of about 5µ.

3. The device of claim 2, wherein each of said trenches are lined with a thin oxide layer.

* * * * *